United States Patent [19]

Murtha

[11] Patent Number: 4,716,258

[45] Date of Patent: Dec. 29, 1987

[54] STAMPED CONCENTRATORS SUPPORTING PHOTOVOLTAIC ASSEMBLIES

[76] Inventor: R. Michael Murtha, 1010 Janetwood Dr., Oxnard, Calif. 93030

[21] Appl. No.: 6,373

[22] Filed: Jan. 23, 1987

[51] Int. Cl.[4] .............................................. H02N 6/00
[52] U.S. Cl. ................................... 136/246; 98/121.1
[58] Field of Search ........................................ 136/246

[56] References Cited

U.S. PATENT DOCUMENTS

| | | | |
|---|---|---|---|
| 1,951,404 | 3/1934 | Goddard | 126/438 |
| 2,144,528 | 1/1939 | Ewald | 98/121.1 |
| 2,145,073 | 1/1939 | Drake | 98/121.1 |
| 2,366,224 | 1/1945 | Warp | 98/121.1 |
| 2,945,417 | 7/1960 | Caryl | 126/451 |
| 3,403,615 | 10/1968 | Dayus | 98/121.1 |
| 3,861,379 | 1/1975 | Anderson | 126/425 |
| 4,016,861 | 4/1977 | Taylor | 126/436 |
| 4,159,710 | 7/1979 | Prast | 126/425 |
| 4,173,213 | 11/1979 | Kelly | 126/425 |
| 4,228,789 | 10/1980 | Kay | 126/439 |
| 4,234,354 | 11/1980 | Lidorenko et al. | 136/246 |
| 4,249,514 | 2/1981 | Jones | 126/438 |
| 4,281,640 | 8/1981 | Wells | 126/438 |
| 4,296,731 | 10/1981 | Cluff | 126/424 |
| 4,463,749 | 8/1984 | Sobczak et al. | 126/451 |
| 4,519,384 | 5/1985 | Murtha | 126/438 |
| 4,604,494 | 8/1986 | Shepard, Jr. | 136/246 |
| 4,683,348 | 7/1987 | Pidgeon et al. | 136/246 |

FOREIGN PATENT DOCUMENTS 330730 10/1935 Italy .................................. 350/613

OTHER PUBLICATIONS

Article, Fred Barden, "New Solar Concentrator Dish Taylored for Industrial Use", 8-1981, p. 23, *Solar Age Magazine*.

*Primary Examiner*—Aaron Weisstuch

[57] ABSTRACT

An advanced slatted reflector is provided to collect and concentrate solar energy. In its simplest form the module is a louvered sheet material platform that is mounted with a photovoltaic cell assembly. The one-piece unit is a mass-producible stamping of ribbed monocoque construction. Light reflective louvers of the stamping are interconnected by a common-border-area grillage that maintains the louverwork position and inclination. The louvers can be patterned in novel configurations to improve the electrical output of solar cells and increase their service lifetime. The lightweight stamping eliminates the complexity and assembly time associated with the mirror strips of prior art slatted concentrators.

4 Claims, 11 Drawing Figures

U.S. Patent Dec. 29, 1987 4,716,258
FIG. 1
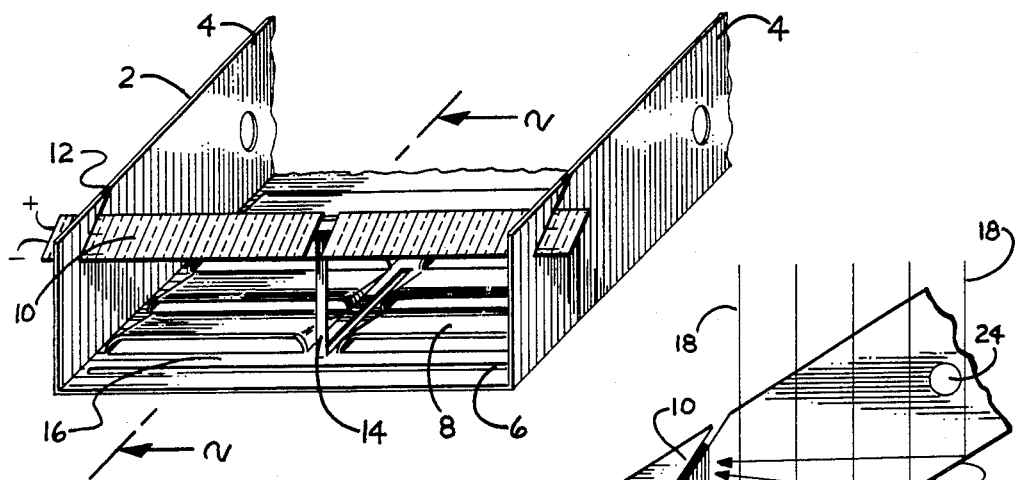
FIG. 2
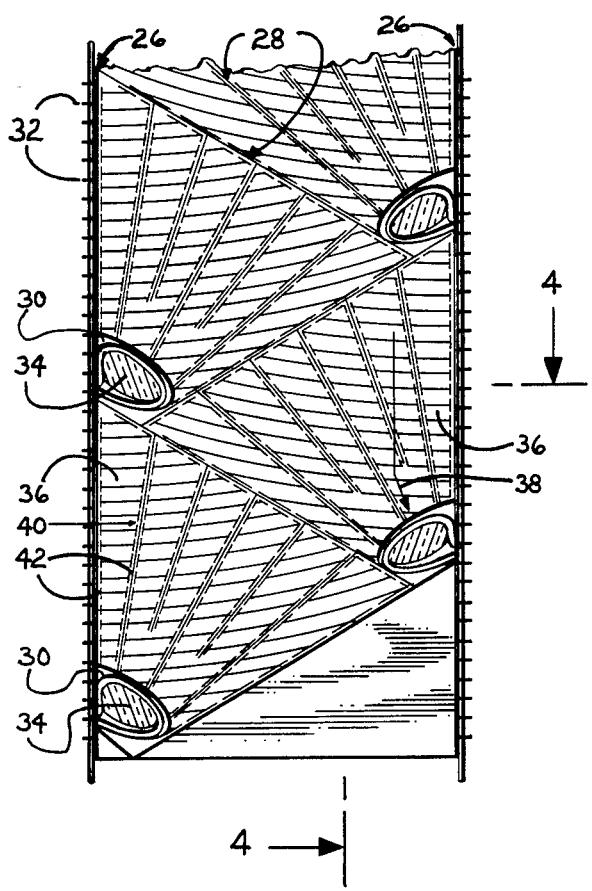
FIG. 3
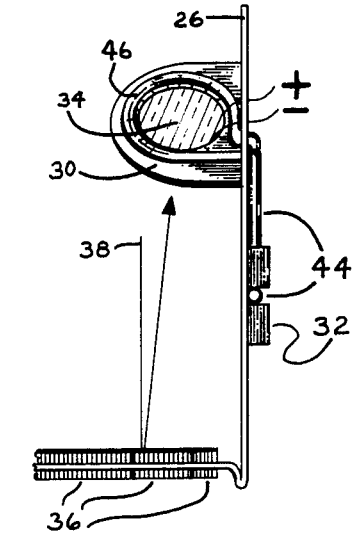
FIG. 4

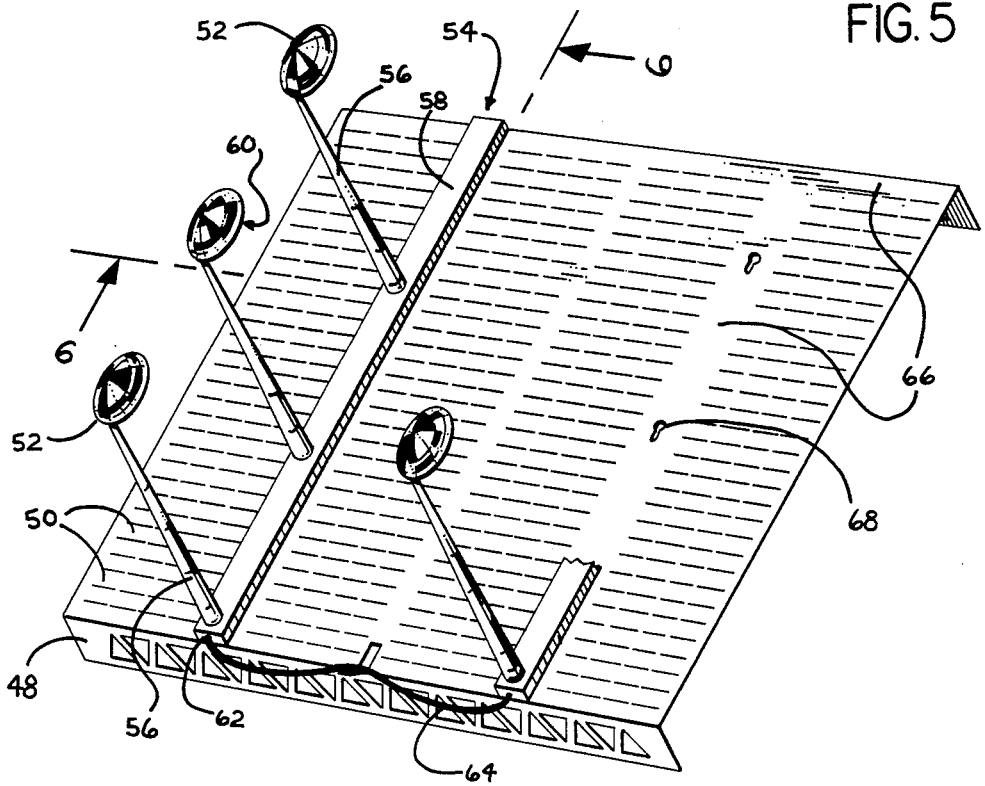
FIG. 5
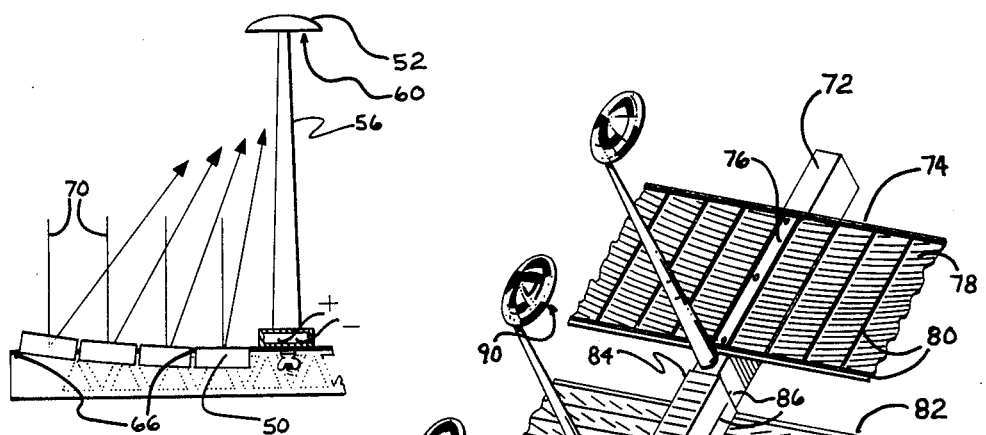
FIG. 6
FIG. 7

STAMPED CONCENTRATORS SUPPORTING PHOTOVOLTAIC ASSEMBLIES

BACKGROUND OF THE INVENTION

This invention relates to solar energy collectors that track the sun throughout the year. More particularly, the present invention is concerned with concentrator type collectors that use mirror strips to reflect solar radiation to a focal zone.

It is now well established that the cost of solar electricity (photovoltaics) can be greatly reduced when an inexpensive optical material is used to concentrate a large area of sunlight upon the small area of a solar cell. In this manner a single photovoltaic cell will generate the same amount of direct current electricity as would many expensive cells.

Presently, parabolic reflectors and Fresnel refractors are used to concentrate sunlight on cells. Though effective, they are about three times too expensive to be cost-competitive with conventional power plants.

Another type of concentrator is the "slatted" mirror. These reflectors, as shown in U.S. Pats. Nos. 1,951,404 and 2,945,417 use narrow mirror strips, or slats, to perform work. The focal zone that these reflective slats produce is distinctly advantageous to concentrator photovoltaics. In operation, to bring sunlight to convergence, the slats are set at progressively different angles in a framework. The slats reflect many rectangular paths of light that combine, one on top of the other, upon the rectangular face of the solar cell. This "stacked" type focal zone uniformly illuminates the whole cell face which results in a superior electrical conversion efficiency. Furthermore, the evenly distributed character of concentrated sunlight insures that no extreme temperature excursions occur upon the cell. This prolongs the service life of expensive solar cells and their solder joints thus increasing module durability and reliability.

However, these unique advantages cannot overcome the high material cost and labor content involved with prior art slatted modules. Their parts are very complicated to produce and awkward to assemble. For example, each slat must be manufactured to include a fastener at both ends. Then both ends of each slat must be inserted into precisely drilled holes in an expensive frame. Mounted on a fixture and using ray tracing techniques, each slat must be inclined in a manner that assures accurate reflection geometry. Then each of the slats' fasteners must be carefully tightened without changing the inclinations. The result is a delicate and complex device that has highly desirable optical characteristics. In view of their potential impact as photovoltaic concentrators a real need exists to radicaly improve the cost-effectiveness of manufacturing slatted reflectors.

In U.S. Pat. No. 4,519,384 by the present inventor, there is shown an enclosed slatted mirror that begins to eliminate the multitude of parts associated with the prior art. In that patent I show, but do not claim, one-piece louvered sheet material as the optical element. Mounted in a framework, this panel uses stamped louvers to concentrate sunlight rather than individual mirror slats of the prior art. Louvered sheet material was developed for heating and ventilation purposes as a simple, yet sturdy, grill that can be found in most homes and offices today. As embodied in U.S. Pats. Nos. 2,366,224 and 3,403,615, these louvered and ribbed stampings are very inexpensive to mass-produce.

It is prudent to incorporate louvered sheet material and slatted solar concentrators as this combination of art produces an increased electrical efficiency and a lighter module that requires far fewer parts than had heretofore been used or thought necessary. Highly advanced modules are presented hereupon.

SUMMARY OF THE INVENTION

All of the modules of the present invention are to be mounted on heliostats to track the sun throughout the day and year. The modules will be electrically interconnected and designed to deliver a specified voltage and current.

One-piece, louvered and ribbed, sheet material stampings of monocoque construction are the basis for this invention. Many novel and well known module shapes are feasible using the louvered sheet material.

The reflective louvers of each module are angled during stamping to bring sunlight to a convergence. The louvers are connected and held in place by a unifying common-border-area that can be formed as a rib. These border area ribs make the module rigid by distributing the weight of the structure evenly.

In accordance with the present invention a common-border-area, or rib therein, supports the photovoltaic cell assembly in a fixed aligned position with the louvers. The louvers reflect and concentrate sunlight onto the photovoltaic cell, thereby maximizing its electrical output.

Heat sink type louvers, formed of the same sheet material, can be used in relationship with the photovoltaic cell to further improve the efficiency of the module.

All prior art concentrator modules are made up of three separate components: first, the optical element, second, the structural housing, and third, the photovoltaic cell assembly. The primary object of this invention is to combine these components together in a simple and inexpensive stamping that is dedicated to the task of concentrating light for photovoltaics.

Another important object is to generate new reflecting geometries and focal zones by using novel louverwork patterns that are available only on one-piece louvered stampings.

Other objects and advantages will become apparent from the following detailed description when read in connection with the accompanying drawings.

BRIEF DESCRIPTION OF THE DRAWINGS

FIG. 1 is a perspective view of the first embodiment of the invention, the "line focus flat-bottom channel" module.

FIG. 2 is a portional cross section view taken along lines 2—2 of FIG. 1.

FIG. 3 is a plan view of the second embodiment, the "spot focus flat-bottom channel" module.

FIG. 4 is a portional end view taken along lines 4—4 of FIG. 3.

FIG. 5 is a perspective view of the third embodiment, the "platform" type module.

FIG. 6 is a portional end view taken along lines 6—6 of FIG. 5 showing versatility of stamped louverwork.

FIG. 7 is a representational view of three more "platform" type modules.

Figure 8:
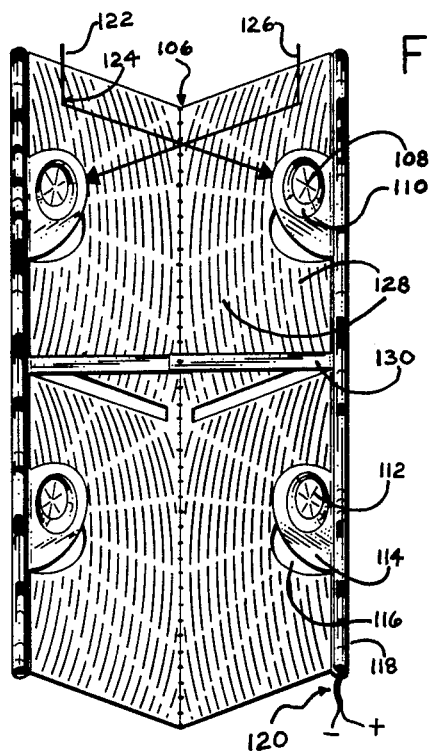
FIG. 8 is a perspective view of the fourth embodiment, the "V" shaped module.

The figures show singular modules that can be either propagated in any axis through geometric scaling, or, linked together to form arrays.

DESCRIPTION OF THE PREFERRED EMBODIMENTS

This invention is amenable to innumerable modifications and alternative constructions. Therefore, only preferred embodiments are referred to in the description, shown in the drawings, and set forth in the claims.

Turning now to FIG. 1, there is shown a module portion in which a solid blank sheet of reflective aluminum 2 has been stamped or formed into the shape of a flat-bottom channel. Parallel ribs 4 impart a structural rigidity in the longitudinal axis of the module, while bead 6 and hooded-slot louvers 8 impart rigidity in the transverse axis. The module must be a stiff monocoque construction to insure that the louver reflections are kept accurate. In this instance the module is a line concentrator wherein the long linear louvers reflect narrow paths of light upon the cell assembly. The linear photovoltaic cell assembly 10, including the cell string, is supported by the ribs 4. Cell assembly 10 is oriented on the module by receptacle slots 12 formed of the ribs. The cell assembly is light and relatively rigid, but if the distance between the ribs is very wide then a tap type rib 14 would be required to also support the assembly. The tab type rib 14 is formed of the common-border-area 16 during the stamping process.

FIG. 2 is a cross section view taken along line 2—2 of FIG. 1. The flat-bottom line concentrator can be very long with, as an example, twenty cell assemblies 10, located on the channels' ribs. A plurality of reflective louvers 8 are devoted to each cell assembly. Each louver 8 reflects a rectangular path of light, as represented by rays 18, directly to the cell assembly 10 because each louver is angled differently by a die during the stamping process. In order to maximize usage of the reflecting surfaces the dies are shaped to cause the louvers to vary their depths in the sheet material plane 20. Open spaces 22 between the louvers are a pervasive characteristic of the stamped modules. During tracking the module is tilted off-axis, in relationship to the incoming parallel rays of the sun, to assure that no rays 18 are allowed to pass between the louvers unreflected. Holes 24 may be used to attach modules together, or, as an axis point for tracking the sun.

FIG. 3 shows a portion of a preferred embodiment that is similar in appearance and in tracking mode to FIGS. 1 and 2. However, it discloses a multiple spot focus module. Ribs 26 and beads 28 make the module rigid. Receptacle tabs 30 and heat sink louvers 32 are stamped onto the aluminum sheet before the ribs are folded up in a separate process. Receptacle tabs 30 hold the solar cell 34 at a predetermined angle to efficiently receive the concentrated sunlight. Louvers 36 are rigid, segmented, parabolic sections that are tilted at progressively different angles to bring sunlight as 38 to a convergence upon the cell assembly 34. Reflective flap louvers 36 are held and positioned by a transition twist 40 connected to common-border-area 42.

FIG. 4 is a partial elevation view taken along lines 4—4 of FIG. 3. Receptacle tabs 30 are punched with a notched hole during stamping to where the photovoltaic cell assembly 34 is mounted by pressing into place. The solar cell assembly 34 is an environmentally-sealed package similar in construction to an automobile headlight. The cell assembly contains the photovoltaic cell, secondary reflector, diode and leads. Heat sink louvers 32 and tubing 44 mounted therein are provided on the ribs 26. In practice a fluid runs through the tubing 44 actively cooling the cells by conduction at 46. Heat sink louvers 32, in turn, absorb the heat from the tubing and radiate it through natural convection to the surrounding air thereby optimizing the module efficiency. Light path, as represented by ray 38, is directed toward its tab 30 by the angled louver 36. The metal sheet is approximately fifteen-thousandths of an inch thick.

It is to be understood that all of the sheet material stampings of the present invention are made from blanks that have been prepared in one or more ways before the stamping/pressing operation occures. For instance, the sheet stock must be of a thickness, hardness, and ductility that is appropriate for bend allowances required of monocoque construction. The sheet must be able to withstand a slight drawing operation in critical areas such as at the louver ends and bead areas as well as at the folds of the ribs and flanges. The sheet is to have a highly reflective finish and may consist of aluminum, aluminized acrylic mirror or stainless steel.

Inexpensive dies may be used during proof-of-concept prototyping of the modules. The final "hard" dies required to stamp the sheet with louvers, tabs, ribs, slots and other features would include a male and female set or a punch used in combination with a die plate. The sheet is fed between the two dies. During the moment of stamping the louvers are formed by a lancing or slitting operation of the dies. Hooded-slot, flap type and tab type louvers and their variations in combination with common-border-areas are used in the present invention. The decisions and operations involved with producing these precision stampings would be based upon well developed sheet material theory and practice as exists in the sheet metal and plastic industry today, and more particularly, among persons involved with sheet material grill and register manufacturing.

FIG. 5 is a different preferred embodiment in the basic shape of a platform with ribs 48. Made of acrylic plastic mirror, this module is self-supporting, using fewer of the expensive branch ribs that normally would support a module on a heliostat. FIG. 5 is also made to track the sun in an off-axis mode at an angle that insures that light does not escape through the open spaces between the louvers. The module is a multiple spot focus concentrator having louvers 50 positioned to reflect light to single cell holders 52. The photovoltaic cell assembly 54 is composed of a plurality of cell holders 52 mounted on tubes 56 and attached to a base 58. The cell holders 52 include a secondary reflector encompassing a self-contained solar cell 60. Electrical leads run from the cell buss bars through the tube 56, which protects the wiring from stray focal spots, and into the base 58 to a terminal 62 located at the end of the base. Electrically isolated from the louvered reflector by the base, cell assembly 54 is connected by a cable 64 to adjacent cell assemblies. Cell assembly 54 is supported on the module by the common-border-area 66. Cell assembly 54 is to be easily unattached from the module by using securing means 68 such as a simple slotted hole used in connection with a threaded pin and nut, of the base. Stamped as a truss, rib 48 maximizes lightness and rigidity.

FIG. 6 shows a section of the platform module taken along lines 6—6 of FIG. 5. It shows how the straight, variably inclined louvers of FIG. 5 are positioned to bring sunlight 70 to spot convergence at the solar cell 60. The louvers 50 are stamped descending through the plane of the sheet material. Canted in their positions and held by the common-border-area 66, these novel louvers allow the flat sheet to act as a parabolic equivalent.

In FIG. 7 the cell assembly 72, including tubes, solar cell and base, is equivalent to the assembly of FIGS. 5 and 6. The upper louvered sheet 74 is situated and attached to the assembly 72 at a common-border-area 76. The cell assembly 72 is very light and easily supported by the common-border-area 76 which, in turn, is stabilized by the louvers 78 and beads 80. Louvers 78 are curved, interrupted, and supported by additional border areas and beads. This is advantageous as multiple supports improve beam delivery accuracy.

The middle panel 82 is louvered plastic mirror. Located centrally of the sheet is a folded rib member 84 that supports and orients the cell assembly 72. Cradled in the rib, the assembly is also supported by the interaction of friction beads 86 with mating profiles of the cell assembly. Tab type louvers 88 are patterned in horizontal parallel rows and progressively tilted in their rows to reflect light to a solar cell located at 90.

Louvered sheet 100 is made like a shoe box lid with ribs at all four edges. It is pinned to and supports the cell assembly 72 at one edge 102. The tab louvers 104 are patterned in diagonal parallel rows, when compared to those of the upper panels, showing the versatility of louvered sheet material. The louvers are periodically interrupted in their extent and supported by common-border-areas. All of the panels of FIG. 7 are made to track the sun in an off-axis mode.

The louvers of the present invention are unique and economically available only through the use of lightweight louvered sheet material. Louver patterns of the present invention would be too complex to assemble if one were to use the heavy individual mirror strips of the prior art slatted concentrators. If individual mirror strips were used to duplicate these louver patterns the resultant slatted module would be hand made, involving hundreds of pieces and would be extremely delicate. Whereas louvered sheet material is a single piece, highly reliable mechanical stamping, with a production rate of, possibly, one unit per second. Louvered sheet material gives the photovoltaic specialist the freedom to choose virtually any configuration of reflection geometries and concentration ratios. The engineer now has control to produce a specific voltage and current from nearly any shape of module that a situation may require.

All louver patterns of the present invention are maintained upon or within the flat surface of the sheet material. High concentration ratios and uniform illumination profiles are produced by periodically segmented louvers eliminating the long, looping, unbalanced, and unsupported slats of the prior art.

The louvers can be stamped with straight or curved edges in the longitudinal axis. In the short axis they are preferrably planar and with approximate the width of the solar cell. Specialized louvers, where the short axis is compound planar (creased) or parabolic, are easy to stamp and increase the concentration ratio. The short axis can also be stamped convex to slightly disperse the light in which case the louvers can be made smaller. Convex louvers can be used to improve the uniform illumination of the cell face and its secondary reflector.

All of the modules employ reflective louvers to concentrate parallel rays of sunlight. The modules also stay cooler because of the louvers. Louver edges increase surface area whereby heat can be more effectively convected away from the module. Louvers, and attendant open spaces therebetween, make the module porous which inhances air current flow past the hot solar cells, further improving module conversion efficiency. Such porosity allows the module to be very tolerant of wind making large arrays less likely to de-focus or sustain damage during high winds.

Although the module is highly reflective and porous, in operation it will absorb a small amount of solar heat. Heat gain calculations are simplified as the module is one material and one thickness. The louvers, border areas and ribs will absorb heat at different rates due to their various inclinations. It may be necessary to place appropriately sized heat sink slots near the ends of the louvers, or in the immediately adjacent common-border-area, to eliminate any temperature gradation expansion in order to maintain exact louver inclinations. This is especially important when a louvered primary reflector is mounted with photovoltaic cells in a Cassegrain configuration. In this situation a separate secondary reflector, possibly louvered sheet material, is used in a two-reflection device to greatly improve the cells beam acceptance angle.

In FIG. 8 there is shown a different preferred embodiment in the basic form of a "V" shaped trough that has been folded lengthwise at perforations 106. This modular stamping is made of thin, highly polished stainless steel, or the like, and supports a plurality of solar cells such as 108. This spot concentrator is intended to reflect a twenty sun concentration ratio to each cell. Each cell 108 is mounted inside a formed cup 110 and bonded to the metal using a filled silicone adhesive. Cups 110 are secondary reflectors stamped into the same sheet material as that of the primary reflector. Also called buttons or bosses, the cups redirect light that is slightly askew, onto the solar cell face. The cups are populated with heat sink type louvers 112 that passively ventilate heat or otherwise, air-cool the solar cell. The cell, cup and heat sink louvers are included upon a receptacle tab 114. This tab, which also orients the cell, is a feature formed of the samesaid sheet material as the primary reflector. Cutouts 116 are open spaces left by the tabs during stamping. Narrow ribs 118, or wired edges, run coextensive of the module and are formed to provide a snap-on capability for attachment to a heliostat. They also function as a protective conduit for the wiring harness 120 that is fed by the photovoltaic cells. Light ray 122 reflects from louver 124 on one side of the primary reflector to a solar cell on the opposite side of the module. Ray 126 reflects in like manner, across to the other side. This "crossed" type geometry is beneficial to many configurations of louvered sheet material as it replaces cell assembly riser tubes with sturdy integral sheet material fixtures (receptacle tabs). Common-border-areas 128 lend rigidity and separate the rows of curved, segmented louvers 124. Stiffeners 130, formed of the sheet, are joined at the center and help maintain the modular trough shape.

Sheet material integral rib structures are used throughout the present invention. These structures include sheet material features such as: ribs, beads, bends, flanges, channels and bosses. In some cases special ribbed louvers and common-border-areas are equivalent to rib type structures. Either folded in or stamped, these features serve to stiffen and add to the buckling resistance of the sheet material. The stiffening properties of ribs make possible a unit-body or monocoque structure which allows the unit to become a weight bearing platform. The weight bearing platform of the present invention is then loaded at specific points along its rib structure(s) with a lightweight photovoltaic cell assembly, making the unit a complete concentrator module. Generally, these rib structures are very strong and require no handling as they are an integral part of the louvered module and do not need to be attached by fasteners. Not only are rib structures used to replace module frameworks, they are also intended to eliminate, reduce, or, at least, limit the number of expensive separate branch members associated with the torque tube of a heliostat. Both single and double fold ribs can be used to dampen the effects of vibration and thermal cycling.

It should be understood that the photovoltaic cell assembly will be the smallest but most expensive part of the concentrator module. In the event that the louvered reflector or the cell assembly becomes damaged and needs to be replaced it should be a simple operation to disassociate them. Therefore, during the stamping operation, features such as shaped holes, slots, notches, and friction channels are to be included in the rib structure areas that enhance the alignment and quick-connection capabilities of the photovoltaic cell assembly. In like manner, damaged adjacent modules are to be stamped with quick-connection features to facilitate their replacement.

Figure 9:
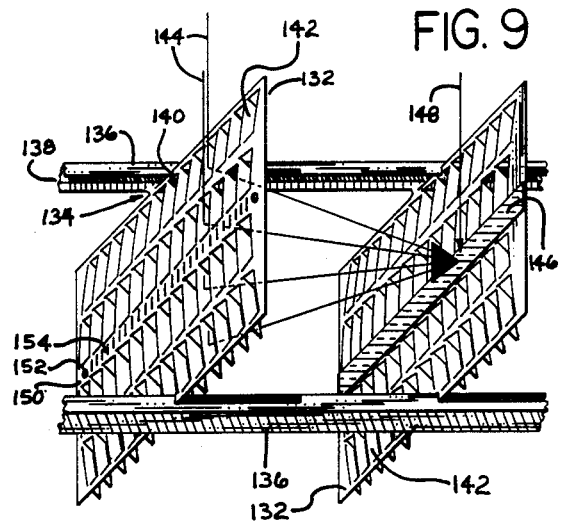
FIG. 9 is a perspective view of the fifth embodiment, the "tray-like" module.

FIG. 9 is a portion of a different preferred embodiment in which reflective sheet aluminum is stamped with large louvers that contain smaller louvers and photovoltaic cell assemblies. This "tray-like" module is formed of the single piece of sheet material. Large frame louvers 132 are unified and held in position by a common-border-area frame at transition area 134. Border are frame 136 is flanged 138 and notched 140 during stamping to index and retain the large planar louvers 132 in proper position. The large louvers are populated with curved and segmented reflecting louvers 142 that are inclined, in this case, at the same angle. They reflect light rays 144 through and behind the plane of the large frame louvers 132 to convergence upon linear photovoltaic cell assembly 146 located on an adjacent frame louver. Adjacent frame louvers may be brought closer together in order to use all available sunlight, with "pinch beads" formed of the common-border-area frame 136. This module can be mounted in a tiered system where two modules are positioned one above the other with the large louvers of the lower module located below and between the large louvers of the upper module. A concentration of ten to twenty suns is anticipated for this module that is to be steered directly toward the sun in at least one axis. An additional sun represented by ray 148, shines directly upon the cell assemblies. Common-border-area seat 150 provides a sturdy grillage that supports a cell assembly, as 146, along its length. This seat area 150 is perforated 152 to provide a snap-in capability for the cell assembly. It is also populated with heat sink louvers 154 that are distributed along its length. Photovoltaic cell assembly 146 is an encapsulated cell string composed of ARCO Cz or Solarex poly silicon cells, for example.

Figure 10:
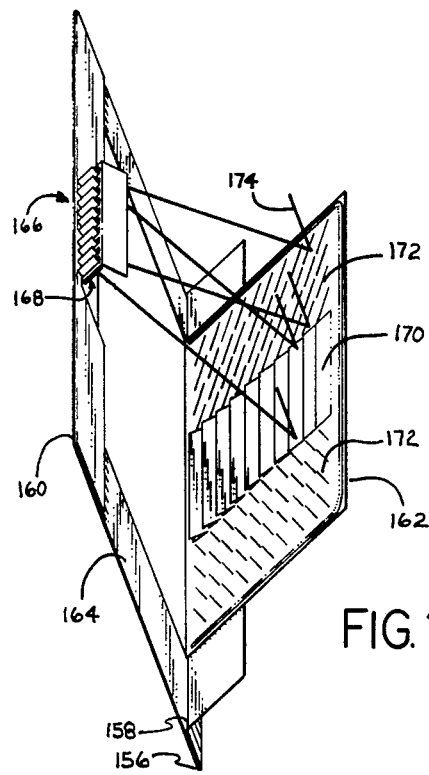
FIG. 10 is a perspective view of the sixth embodiment, the "foldout" module.

FIG. 10 shows a different preferred embodiment constructed of one-piece louvered sheet material: a "foldout" module. As with all the modules, a blank of reflective sheet material is placed between a set of dies in a press. The flat stock is then struck or stamped by the dies with louvers, beads, perforations, and long slits. After removal from the press, the stamping is then machine, or manualy, folded along perforations at 156, 158 and 160 resulting in strongback ribs, support ribs, and stiffening ribs, respectively. The louvered panel 162 is also folded out and held in position by support rib 158. The folding out of the panel leaves a standing rectangular rib member 164. Housing 166 formed of samesaid sheet material is located centrally of the upper quarter of the standing rib member. Housing 166 is a secondary reflector that also attaches and orients the short photovoltaic cell assembly 168. Heat sink louvers are located in the upper surface of the housing. The panel 162 contains louverwork that produces a unique "short line" focus that is economicaly available only through the use of stamped sheet material. Short linear louvers 170, located centrally of the panel, are the same length as cell assembly 168. They are inclined at progressively different angles and reflect rectangular paths of sunlight upon the closely associated photovoltaic cells of the cell assembly 168. Tilted tab louvers 172, located on both sides of the linear louvers 170, boost the concentration ratio by reflecting light diagonally 174 onto the cell assembly 168. The additional concentrated radiation would, for example, nearly triple the electrical output of the cell string. Rib member 164 of the module is to be pointed directly toward the sun during operation.

Figure 11:
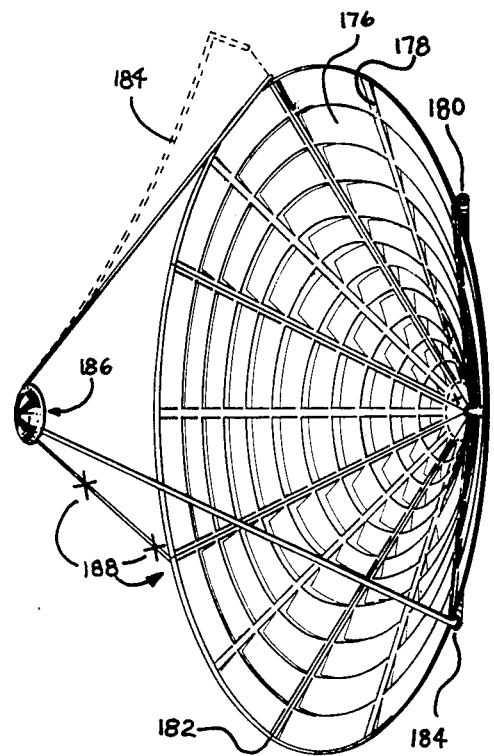
FIG. 11 is a perspective view of the seventh embodiment, the "shallow cone" module.

FIG. 11 is a different preferred embodiment in the basic shape of a shallow cone having flat sides in cross section. The flat sided cone lacks the expensive parabolic framework associated with the similarly appearing parabolic dish. The module is prepared by first locating the center of a piece of circular reflective sheet material and then cutting out a "pie section" of about thirty degrees. The sheet is then stamped in a flat position with louvers 176 and common-border-areas 178 that contain stiffener/friction channels 180. The edges of the cut out section are brought together at 182 and secured forming the cone. Friction channels 180 engage and support snap-in struts 184 of the cell assembly. The cell assembly positions the solar cell 186 directly in front of the module. The module is steered directly toward the sun and can be designed to produce a fifty to five-hundred sun geometric concentration ratio. Curved and periodically interrupted, the variously inclined louvers 176 redirect incoming sunlight to the cell face. Multiple focal zones 188 indicate when focal spots may be trained if so desired, by reconfiguring the louvers. A square (pyramidal) version of this module is available due to the versatility of the louvers.

The invention has been described in detail with particular reference to the preferred embodiments thereof, but it should be understood that reasonable variations and modifications are possible without departing from the spirit and scope of the invention.

What I claim is:

1. A radiant energy concentrating collector comprising:
    reflective sheet material formed as a module and having stamped louvers therein with open spaces therebetween and connected by common-border-areas, said common-border-areas including rib means, said rib means supporting a photovoltaic cell assembly, the louvers being positioned to reflect sunlight falling on the module to said photovoltaic cell assembly.

2. The module as defined in claim 1 wherein:
the sheet material is also formed with heat sink louvers that further support and cool said photovoltaic cell assembly.

3. The module as defined in claim 1 wherein:
the sheet material is also formed as a secondary reflector that further supports and concentrates light upon said photovoltaic cell assembly.

4. The module as defined in claim 1 wherein:
said common-border-area or rib means therein is formed to provide a securing means to further support said photovoltaic cell assembly.

* * * * *